(12) United States Patent
Otremba

(10) Patent No.: US 9,524,941 B2
(45) Date of Patent: Dec. 20, 2016

(54) POWER SEMICONDUCTOR HOUSING WITH REDUNDANT FUNCTIONALITY

(71) Applicant: Infineon Technologies AG, Neubiberg (DE)

(72) Inventor: Ralf Otremba, Kaufbeuren (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 14/036,019

(22) Filed: Sep. 25, 2013

(65) Prior Publication Data
US 2014/0091401 A1 Apr. 3, 2014

(30) Foreign Application Priority Data
Oct. 2, 2012 (DE) .................. 10 2012 019 391

(51) Int. Cl.
*H01L 27/088* (2006.01)
*H01L 23/58* (2006.01)
(Continued)

(52) U.S. Cl.
CPC ......... *H01L 23/58* (2013.01); *H01L 23/49524* (2013.01); *H01L 23/49562* (2013.01);
(Continued)

(58) Field of Classification Search
CPC ............... H01L 23/58; H01L 23/49562; H01L 23/49524; H01L 24/49; H01L 24/48; H01L 2224/85399; H01L 2224/05599; H01L 2924/00014; H01L 2924/1305; H01L 2924/13055; H01L 2924/1306; H01L 2924/13091; H01L 2224/48247; H01L 2224/4903
(Continued)

(56) References Cited

U.S. PATENT DOCUMENTS 6,249,041 B1 * 6/2001 Kasem ................ H01L 23/4951
257/666
6,476,481 B2 * 11/2002 Woodworth et al. ......... 257/696
(Continued)

FOREIGN PATENT DOCUMENTS

CN 1510744 A 7/2004
DE 10303933 A1 8/2004
(Continued)

OTHER PUBLICATIONS

English language abstract for DE 103 03 933 A1 dated Aug. 19, 2004.

*Primary Examiner* — Phat X Cao
*Assistant Examiner* — Mohammad M Hoque

(57) ABSTRACT

In various embodiments, a power semiconductor housing having an integrated circuit is provided. The integrated circuit may include: a first gate pad and a second gate pad; and a first gate contact and a second gate contact; wherein the first gate pad is electrically connected to the first gate contact; wherein the second gate pad is electrically connected to the second gate contact. The integrated circuit may further include a drain-contact surface, wherein the drain-contact surface is connected to a drain contact; and a second drain contact, which is electrically connected to the drain-contact surface of the integrated circuit.

9 Claims, 2 Drawing Sheets

(51) Int. Cl.
*H01L 23/00* (2006.01)
*H01L 23/495* (2006.01)

(52) U.S. Cl.
CPC .............. *H01L 24/49* (2013.01); *H01L 24/48* (2013.01); *H01L 2224/05599* (2013.01); *H01L 2224/0603* (2013.01); *H01L 2224/48247* (2013.01); *H01L 2224/4903* (2013.01); *H01L 2224/85399* (2013.01); *H01L 2924/00014* (2013.01); *H01L 2924/1305* (2013.01); *H01L 2924/1306* (2013.01); *H01L 2924/13055* (2013.01); *H01L 2924/13091* (2013.01)

(58) Field of Classification Search
USPC ......................................................... 257/401
See application file for complete search history.

(56) References Cited

U.S. PATENT DOCUMENTS

| | | | |
|---|---|---|---|
| 6,534,878 B1* | 3/2003 | Sander et al. | 257/784 |
| 7,095,099 B2* | 8/2006 | Oliver et al. | 257/676 |
| 7,208,818 B2* | 4/2007 | Luo et al. | 257/666 |
| 7,375,424 B2* | 5/2008 | Connah | 257/692 |
| 7,615,852 B2 | 11/2009 | Otremba | |
| 7,659,611 B2* | 2/2010 | Otremba | 257/690 |
| 7,898,092 B2* | 3/2011 | Lu et al. | 257/777 |
| 8,330,252 B2* | 12/2012 | Mahler et al. | 257/578 |
| 2001/0019856 A1* | 9/2001 | Takahashi et al. | 438/127 |
| 2001/0044167 A1* | 11/2001 | Kuo | H01L 23/051 438/106 |
| 2003/0173682 A1 | 9/2003 | Bendal | |
| 2003/0183924 A1* | 10/2003 | Bhalla | H01L 24/49 257/723 |
| 2004/0004272 A1* | 1/2004 | Luo et al. | 257/666 |
| 2004/0080028 A1* | 4/2004 | Yanagisawa | 257/675 |
| 2004/0104489 A1* | 6/2004 | Larking | 257/787 |
| 2004/0125529 A1 | 7/2004 | Arai et al. | |
| 2004/0262720 A1* | 12/2004 | Satou et al. | 257/676 |
| 2005/0017339 A1* | 1/2005 | Yoshiba et al. | 257/686 |
| 2005/0145998 A1* | 7/2005 | Harnden et al. | 257/666 |
| 2005/0212101 A1* | 9/2005 | Funato et al. | 257/666 |
| 2005/0224945 A1* | 10/2005 | Saito et al. | 257/686 |
| 2006/0151868 A1* | 7/2006 | Zhu et al. | 257/690 |
| 2006/0249831 A1* | 11/2006 | Connah | 257/690 |
| 2006/0255362 A1* | 11/2006 | Otremba | H01L 23/4952 257/177 |
| 2006/0261473 A1* | 11/2006 | Connah et al. | 257/728 |
| 2007/0057350 A1 | 3/2007 | Otremba | |
| 2007/0145582 A1* | 6/2007 | Otremba | H01L 23/3107 257/728 |
| 2007/0267729 A1* | 11/2007 | Otremba | H01L 23/492 257/678 |
| 2008/0061412 A1 | 3/2008 | Shen et al. | |
| 2008/0061413 A1 | 3/2008 | Otremba et al. | |
| 2008/0246137 A1* | 10/2008 | Mahler | H01L 23/49524 257/690 |
| 2008/0265386 A1* | 10/2008 | Muto | H01L 24/84 257/676 |
| 2010/0123240 A1* | 5/2010 | Sato et al. | 257/692 |
| 2011/0121440 A1* | 5/2011 | Fujiwara et al. | 257/675 |
| 2011/0221005 A1* | 9/2011 | Luo et al. | 257/368 |
| 2014/0334052 A1* | 11/2014 | Hebert | 361/93.9 |

FOREIGN PATENT DOCUMENTS

| | | |
|---|---|---|
| DE | 102005018941 A1 | 11/2006 |
| DE | 102005054872 A1 | 5/2007 |
| JP | 2001352066 A | 12/2001 |
| WO | 9821751 A2 | 5/1998 |

* cited by examiner

POWER SEMICONDUCTOR HOUSING WITH REDUNDANT FUNCTIONALITY

CROSS-REFERENCE TO RELATED APPLICATION

This application claims priority to German Patent Application Serial No. 10 2012 019 391.2, which was filed Oct. 2, 2012, and is incorporated herein by reference in its entirety.

TECHNICAL FIELD

Various embodiments relate to a power semiconductor housing with redundant functionality.

BACKGROUND

In general, various embodiments relate to the improvement of failures in power semiconductor housings when used in applications which require a high level of availability.

In many fields of electronics, it is increasingly necessary for electronic components and systems still to remain functional even if one component fails. For example, in the case of high-power applications, certain fault modes must be completely avoided since these can have a great influence on the entire high-power supply system and, in certain circumstances, may cause failure of the entire system. An example of one such fault mode which occurs may be the occurrence of an open contact in the case of power semiconductor housings, for example in the case of IGBTs (insulated-gate bipolar transistors) or power MOSFETs (metal oxide semiconductor field-effect transistors). Nowadays, in order to avoid the failure of entire electronic systems or electronic assemblies, redundancies for the relevant components are kept available. This means that additional electronic components which still ensure the functionality of the entire system even if one component should fail are incorporated. However, this solution is very costly.

SUMMARY

In various embodiments, a power semiconductor housing having an integrated circuit is provided. The integrated circuit may include: a first gate pad and a second gate pad; and a first gate contact and a second gate contact; wherein the first gate pad is electrically connected to the first gate contact; wherein the second gate pad is electrically connected to the second gate contact. The integrated circuit may further include a drain-contact surface, wherein the drain-contact surface is connected to a drain contact; and a second drain contact, which is electrically connected to the drain-contact surface of the integrated circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 also shows that the power semiconductor housing has redundant source contacts which are connected to the source-contact surface.

DESCRIPTION

Figure 1:
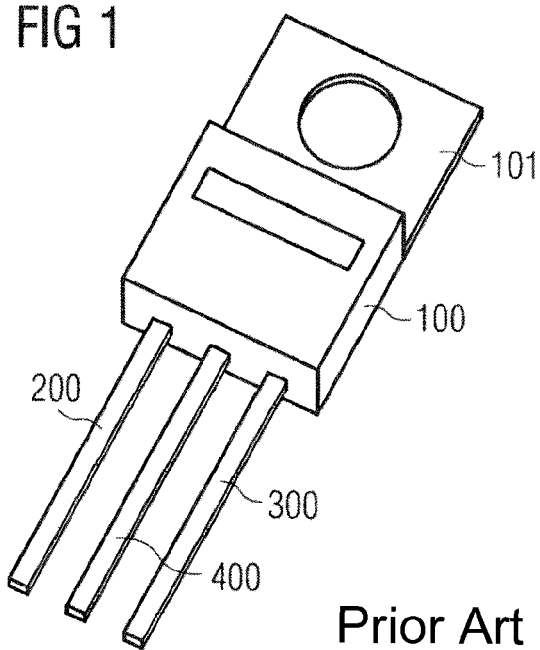
FIG. 1 shows a power semiconductor housing with contacts and cooling and fastening means.

Embodiments of the invention will be explained in more detail below with reference to the appended figures. However, the invention is not restricted to the specifically described embodiments; rather, it can be suitably modified and varied. The suitable combination of individual features and combinations of features from one embodiment with features and combinations of features from another embodiment in order to achieve further inventive embodiments is within the scope of the invention Before the embodiments are explained in more detail below on the basis of the figures, it is noted that identical elements are provided with identical or similar reference signs in the figures and that repeated description of said elements is omitted. Furthermore, the figures are not necessarily drawn to scale. Rather, the focus is on explaining the basic principle.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a power semiconductor component which ensures inexpensively increased fail-safety of electronic components.

In various embodiments, the power semiconductor housing has an integrated circuit (IC) with a first gate pad and a second gate pad and has a first gate contact and a second gate contact, wherein the first gate pad is electrically connected to the first gate contact and wherein the second gate pad is electrically connected to the second gate contact. Alternatively, the first gate pad may also be connected to the second gate contact and the second gate pad may be connected to the first gate contact. Various embodiments may afford the advantage that the gates of the IC are kept available on a redundant basis by means of the gate contacts and the gate pads connected thereto. The fail-safety of the IC may therefore be increased.

In various embodiments of the power semiconductor housing, the IC has a drain-contact surface, wherein the drain-contact surface is connected to a drain contact.

In various embodiments of the power semiconductor housing, the drain-contact surface is formed by means of a chip island and the chip island is designed such that the chip island forms a drain contact. This compact design of the drain-contact surface and the drain contact allows the power semiconductor housing to be manufactured particularly inexpensively and with a compact construction owing to savings in terms of material and surface area.

In various embodiments of the power semiconductor housing, the power semiconductor housing may have a second drain contact, wherein the drain-contact surface of the IC is electrically connected to the second drain contact. These embodiments may afford the advantage that the drain contacts are kept available on a redundant basis by means of said drain contacts and the drain-contact surface connected thereto of the IC. The fail-safety of the IC may therefore be increased.

In various embodiments of the power semiconductor housing, the IC has a source-contact surface, wherein the power semiconductor housing has a first source contact and a second source contact and wherein the first source contact is connected to the source-contact surface of the IC and wherein the second source contact is connected to the source-contact surface of the IC. Various embodiments may afford the advantage that the source-contacts are kept available on a redundant basis by means of the source contacts and the source-contact surface electrically connected thereto of the IC. The fail-safety of the IC and hence the entire power semiconductor housing may therefore be increased.

In various embodiments of the power semiconductor housing, the power semiconductor housing has a first drain contact and a second drain contact and an IC, wherein the IC has a drain-contact surface and wherein the first drain contact and the second drain contact are connected to the drain-contact surface of the IC. Various embodiment likewise may afford the advantage that the drain contacts are kept available on a redundant basis by means of the drain contacts which are electrically connected to the drain-contact surface. The fail-safety of the IC and hence the entire power semiconductor housing may therefore be increased.

In various embodiments of the power semiconductor housing, the power semiconductor housing has a chip island, wherein the chip island of the IC is formed as a drain-contact surface and integrated drain contact. These embodiments likewise may afford the advantage that the drain contacts are electrically connected to the drain-contact surface in a particularly simple and fail-safe way. The fail-safety of the IC and hence the entire power semiconductor housing may therefore also be substantially increased in these embodiments.

FIG. 1 shows a known power semiconductor housing 100 with cooling and fastening means 101, a gate contact 200, a drain contact 400 and a source contact 300.

Figure 2:
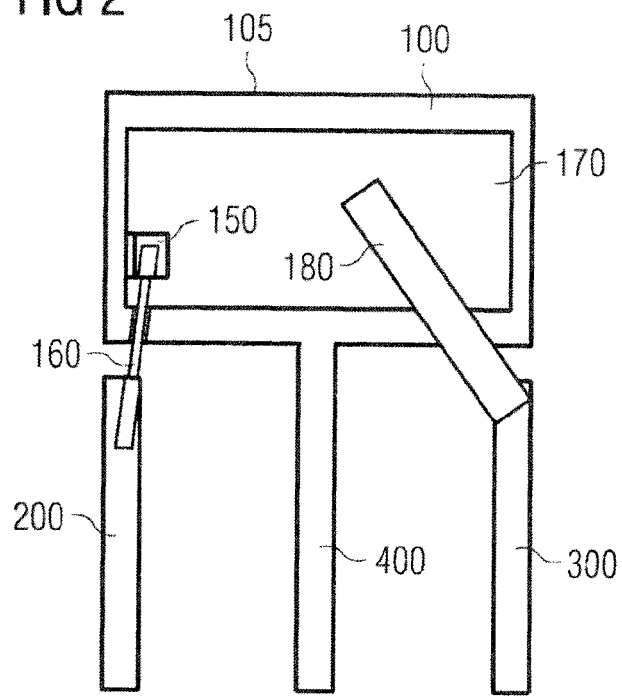
FIG. 2 shows a known power semiconductor housing with drain, source and gate contacts.

FIG. 2 shows a power semiconductor housing 100 with a gate contact 200, a drain contact 400 and a source contact 300. In this case, the gate pad 150 is connected to the gate contact by means of an electrical contact means 160. The electrical connection may e.g. contain Au, Cu, Al or other metallic conductive materials. In addition, the source-contact surface 170 of the IC is connected to the source contact by means of a further electrical contact means 180. The drain contact 400 is directly connected to the drain-contact surface 105.

Figure 3:
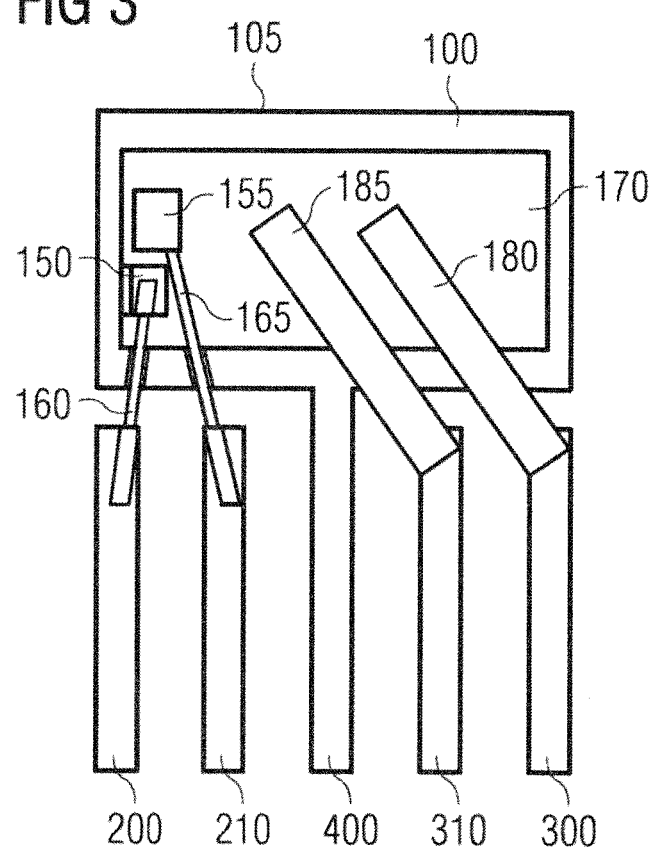
FIG. 3 shows a power semiconductor housing with redundant gate contacts which are connected to a first and a second gate pad.

FIG. 3 shows a power semiconductor housing 100 with a gate contact 200, a drain contact 400 and a source contact 300. In this case, the gate pad 150 is connected to the gate contact 200 by means of an electrical contact means 160. The electrical connection may e.g. contain Au, Cu, Al or other metallic conductive materials. In addition, the source-contact surface 170 of the IC is connected to the source contact by means of a further electrical contact means 180. The drain contact 400 is directly connected to the drain-contact surface 105. The drain-contact surface 105 may be formed as a chip island of the IC and may extend out of the power semiconductor housing as drain contact 400. In addition, the power semiconductor housing can have a second drain contact 410 (not shown here), which can be formed like the first drain contact 400. By means of the depicted arrangement, the drain contacts 400, 410 are duplicated, that is to say they are embodied on a redundant basis, and connected to the corresponding drain-contact surface 105 of the IC. By means of the depicted arrangement, the gate contacts 200, 210 and the corresponding contact connections via the gate pads 150, 155 are duplicated.

FIG. 3 also shows that the IC has a further second gate pad 155. The second gate pad 155 is electrically connected to the IC and is at the same electrical potential as the first gate pad 150. The second gate pad 155 is connected to the gate contact 210 by means of a further second electrical connection 165 and may contain the same materials as the first electrical connection 160.

If one of the electrical connections 160, 165 between gate contacts 200, 210 and gate pads 150, 155 is interrupted, the IC is still fully functional owing to the duplicated (redundant) embodiment of the gate contacts 200, 210. The power semiconductor housing 100 also has a second source contact 310 which is connected to the source-contact array 170 of the IC by means of an electrical connection 185. The source-contact array 170 of the IC is therefore connected by means of two, that is to say on a redundant basis, electrical connections 180, 185 to the two, that is to say likewise embodied on a redundant basis, source contacts 300, 310. In this case too: if one of the electrical connections 180, 185 between source-contact array 170 and the source contacts 300, 310 is interrupted, the IC is still fully functional owing to the duplicated (redundant) embodiment of the source contacts 300, 310.

Figure 4:
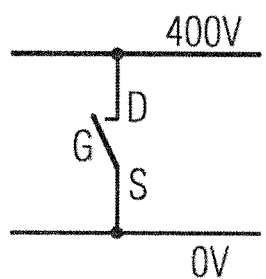
FIG. 4 shows a basic illustration of an electrical circuit for a driver IC.

FIG. 4 shows a basic illustration of an electrical circuit for an IC. The IC has a drain, a source and a gate. In this embodiment, a voltage of 400 V is present at the drain, a voltage of 0 V is present at the source and the IC is switchable by means of the gate. In another embodiment, all redundant contacts of the power semiconductor housing 100 may be switched on a redundant basis by means of an independent electrical circuit.

In various embodiments, a power semiconductor housing having an integrated circuit is provided. The integrated circuit may include: a first gate pad and a second gate pad; and a first gate contact and a second gate contact; wherein the first gate pad is electrically connected to the first gate contact; wherein the second gate pad is electrically connected to the second gate contact. The integrated circuit may further include a drain-contact surface, wherein the drain-contact surface is connected to a drain contact; and a second drain contact, which is electrically connected to the drain-contact surface of the integrated circuit.

In various embodiments, the drain-contact surface is formed by means of a chip island and wherein the chip island also forms a drain contact. In various embodiments, the integrated circuit has a source-contact surface; wherein the power semiconductor housing has a first source contact and a second source contact; wherein the first source contact is connected to the source-contact surface of the integrated circuit; and wherein the second source contact is connected to the source-contact surface of the integrated circuit.

In various embodiments, a method for increasing the fail-safety of electronic components is provided, wherein at least one gate contact and a drain contact are embodied on a redundant basis.

In various embodiments, the electronic components include power semiconductors. In various embodiments, in addition, a source contact is embodied on a redundant basis. In various embodiments, the redundancy is achieved by a duplicate embodiment of the respective contact, with the result that, in the event of an interruption on one embodiment of the respective contact, the power semiconductor still remains fully functional owing to another embodiment of the respective contact. In various embodiments, the power semiconductor has a first contact and a second contact which are connected to a drain-contact surface. In various embodiments, the power semiconductor has a first source contact and a second source contact, wherein the first source contact is connected to a source-contact array via a first electrical connection and the second source contact is connected to the source-contact array via a second electrical connection.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A power semiconductor device comprising an integrated circuit, wherein the integrated circuit comprises:
   at least a first gate pad electrically connected to at least at least a first gate contact;
   at least two drain contacts formed from at least a first drain contact surface and directly connected to the drain contact surface;
   a source-contact surface substantially surrounded by the at least a first drain contact surface;
   at least two source contacts electrically connected to the source-contact surface; wherein the at least a first gate contact is adjacent to the at least two drain contacts and the at least two source contacts; and wherein the at least two drain contacts are disposed on the same side of the integrated circuit as the at least two source contacts.

2. The power semiconductor device of claim 1, further comprising:
   wherein the drain-contact surface further comprises a chip island.

3. The power semiconductor device of claim 1,
   further comprising a second gate pad, and wherein the at least a first gate pad and the second gate pad have the same electrical potential; wherein the first gate pad and the second gate pad are disposed directly next to each other.

4. A method for providing redundant power semiconductor device contacts comprising:
   providing an integrated circuit;
   wherein the integrated circuit comprises:
     at least a first gate pad;
     at least two drain contacts formed from and directly connected to contact electrically connected to at least a first drain contact surface; and
     a source-contact surface substantially surrounded by the at least a first drain contact surface;
   providing at least a first gate contact electrically connected to at least a first gate pad;
   providing at least two source contacts electrically connected to the source-contact surface; wherein the at least a first gate contact is adjacent to the at least two drain contacts and the at least two source contacts; and wherein the at least two drain contacts are disposed on the same side of the integrated circuit as the at least two source contacts.

5. The method of claim 4,
   connecting independently the at least a first source contact and a second source contact to the source-contact surface, wherein the at least a first source contact and the second source contact are independent structures.

6. The method of claim 4,
   connecting redundantly the at least two drain contacts to the at least a first drain-contact surface if the at least a two drain contacts fail.

7. The method of claim 4,
   connecting redundantly a second source contact to the source-contact surface if the at least a first source contact fails.

8. The method of claim 4,
   connecting redundantly the at least a first gate contact to a second gate pad.

9. The method of claim 8,
   connecting redundantly a second gate contact to the first gate pad if the at least a first gate contact fails.

* * * * *